(12) United States Patent
Tsai et al.

(10) Patent No.: US 6,815,356 B2
(45) Date of Patent: Nov. 9, 2004

(54) METHOD FOR FORMING BOTTLE TRENCH

(75) Inventors: Tzu-Ching Tsai, Taichung Hsien (TW); Hsin-Jung Ho, Taipei (TW); Yi-Nan Chen, Taipei (TW)

(73) Assignee: Nanya Technology Corporation, Taoyuan (TW)

(*) Notice: Subject to any disclaimer, the term of this patent is extended or adjusted under 35 U.S.C. 154(b) by 0 days.

(21) Appl. No.: 10/379,445

(22) Filed: Mar. 3, 2003

(65) Prior Publication Data

US 2004/0038553 A1 Feb. 26, 2004

(30) Foreign Application Priority Data

Aug. 20, 2002 (TW) .......................................... 91118772 A

(51) Int. Cl.[7] .............................................. H01L 21/311
(52) U.S. Cl. ...................................................... 438/694
(58) Field of Search ................................ 438/694, 693, 438/692, 396, 386, 3, 243; 257/314

(56) References Cited

U.S. PATENT DOCUMENTS 6,391,706 B2 * 5/2002 Wu et al. .................... 438/243

* cited by examiner

Primary Examiner—David A. Zarneke
Assistant Examiner—Monica D. Harrison
(74) Attorney, Agent, or Firm—Ladas & Parry LLP

(57) ABSTRACT

A method for forming a bottle trench in a substrate having a pad structure and a trench. First, a first insulating layer is formed in the trench, and a portion of the first insulating layer is removed to a certain depth of the trench. Next, a second insulating layer is formed in the trench, and portions of the second insulating layer on the pad structure and the sidewalls of the trench are removed. Next, an etching stop layer is formed in the trench, and a bottom portion of the etching stop layer is removed. Finally, the etching stop layer is used as a mask to remove the remaining second insulating layer and the first insulating layer.

18 Claims, 9 Drawing Sheets

METHOD FOR FORMING BOTTLE TRENCH

BACKGROUND OF THE INVENTION

1. Field of the Invention

The present invention relates to a method for forming a bottle trench, and more particularly to a method for forming a bottle trench using an etching stop layer.

2. Description of the Prior Art

Generally, capacitors in presently extensively used dynamic random access memory (DRAM) include two electrode plates with an insulating material therebetween. The charge storage capacity of the capacitor depends on the insulating material thickness, the surface area of the electrode plates, and the electrical properties of the insulating material. In recent years, the semiconductor design has a trend toward decreased device size in order to obtain higher density. Therefore, the substrate area of the memory cell must be decreased in order for the integrated circuits to accommodate a large number of memory cells. Also, the electrode plate of the memory cell capacitor must have adequate surface area in order to store sufficient charge.

However, with reduction in size, the trench storage node capacitance in the DRAM decreases accordingly. Therefore, there is a need to increase the storage capacitance in order to maintain sufficient memory operation.

Presently, one popular method of increasing the storage capacitance of DRAM forms a bottle shaped capacitor. This increases the width of the trench bottom for increased surface area. FIGS. 1A to 1H are cross-sections illustrating the conventional process flow of forming a bottle trench. First, referring to FIG. 1A, a pad structure 16 including a pad nitride layer 14 and a pad oxide layer 12 is formed on a silicon substrate 10. Then, the pad structure 16 is used as an etching mask to etch the silicon substrate 10 by dry etching, forming a trench 18.

Subsequently, referring to FIG. 1B, a pad oxide layer 20, an etching stop layer 22, and a polysilicon layer 24 are successively formed in the trench 18. Then, an oxide layer 26 is formed by thermal oxidation. Then, a mask layer 28, for example, a photoresist layer, is deposited. The etching stop layer 22 can generally be a nitride layer.

Subsequently, referring to FIG. 1C, the mask layer 28 at the upper portion of the trench 18 is removed.

Subsequently, referring to FIG. 1D, the oxide layer 26 uncovered by the mask layer 28 at the upper portion of the trench 18 is removed.

Subsequently, referring to FIG. 1E, the remaining mask layer 28 is removed.

Subsequently, referring to FIG. 1F, the upper portion of the polysilicon layer 24 is nitrided to form a nitride layer 30.

Subsequently, referring to FIG. 1G, the oxide layer 26 and the polysilicon layer 24 uncovered by the nitride layer 30 at the bottom portion of the trench 18 are removed by wet etching. Next, the nitride layer 30 and the nitride layer 22 at the bottom portion of the trench 18 are removed by wet etching using phosphoric acid.

Finally, referring to FIG. 1H, the residual polysilicon layer 24 at the upper portion of the trench 18 is removed. The pad oxide layer 20 at the bottom portion of the trench 18 is removed by wet etching using the etching stop layer 22 as a mask.

However, the above conventional process uses complicated stacked sacrificial layers. Also, the process is very complicated, and the process time is long, proving detrimental to mass production.

SUMMARY OF THE INVENTION

An object of the present invention is to solve the above-mentioned problems and provide a method for forming a bottle trench. The benefit of the present invention resides in that TEOS (tetra-ethyl-ortho-silicate) is used as a sacrificial etching stop layer in the bottle trench formation. The TEOS layer can be easily removed with hydrofluoric acid solution.

To achieve the above object, the present inventive method for forming a bottle trench in a substrate having a pad structure and a trench includes the following steps. First, a first insulating layer is formed in the trench, and then a portion of the first insulating layer is removed to a certain depth of the trench. Next, a second insulating layer is formed in the trench, and portions of the second insulating layer on the pad structure and the sidewalls of the trench are removed. Next, an etching stop layer is formed in the trench, and a bottom portion of the etching stop layer is removed. Finally, the etching stop layer is used as a mask to remove the remaining second insulating layer and the first insulating layer.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

Figure 1A:
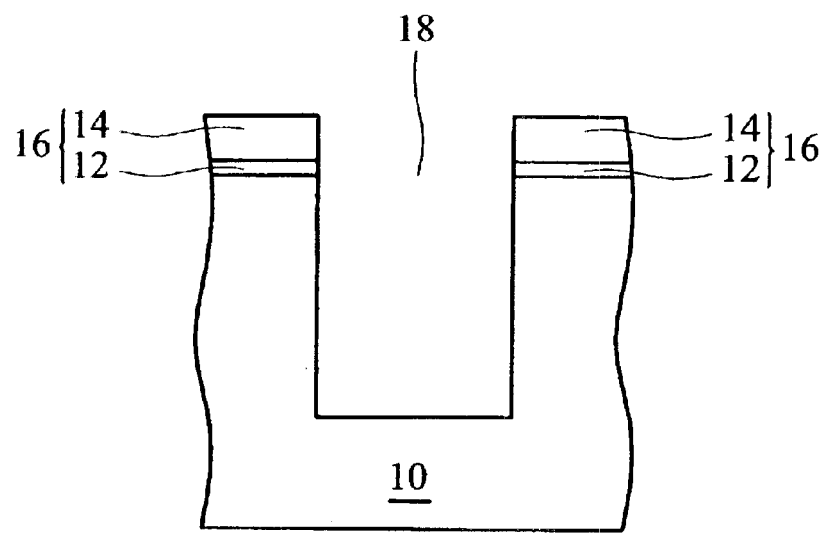
FIGS. 1A to 1H are cross-sections illustrating the conventional process flow of forming a bottle trench.
Figure 1B:
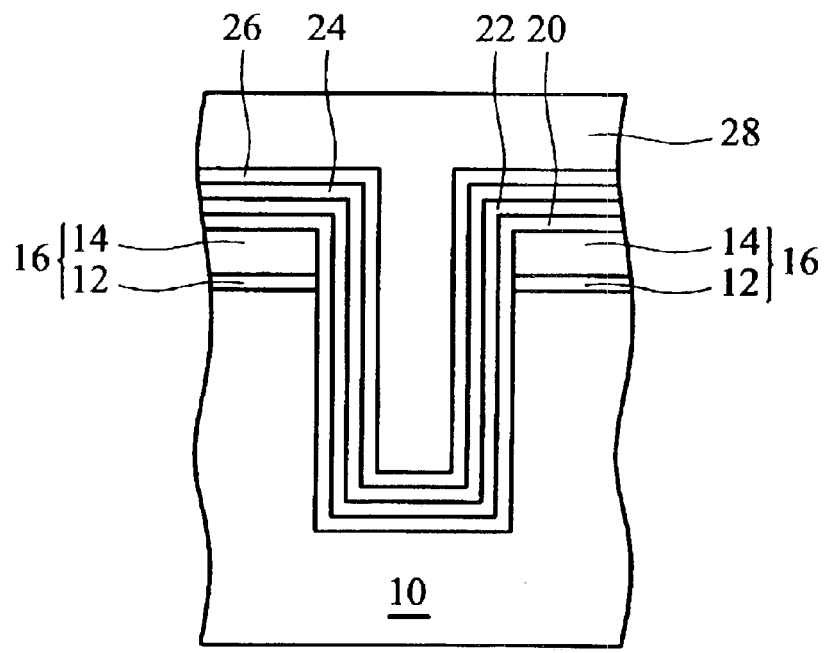
Figure 1C:
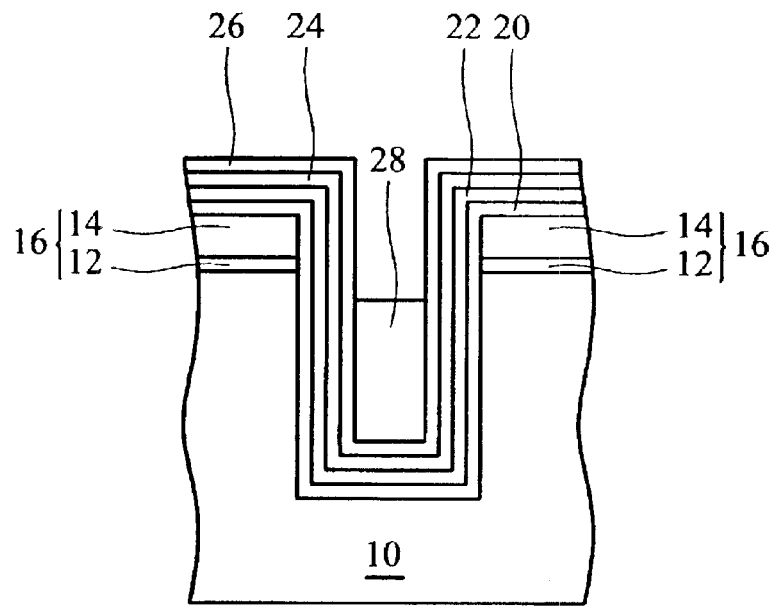
Figure 1D:
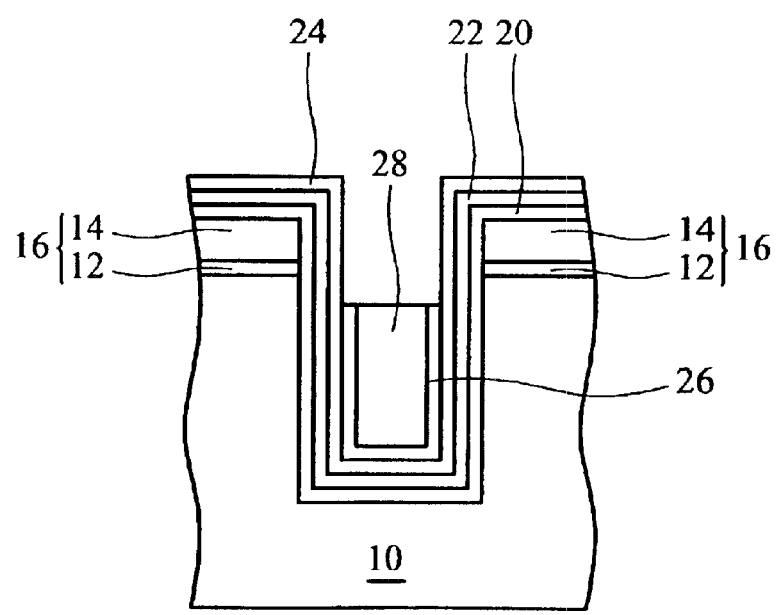
Figure 1E:
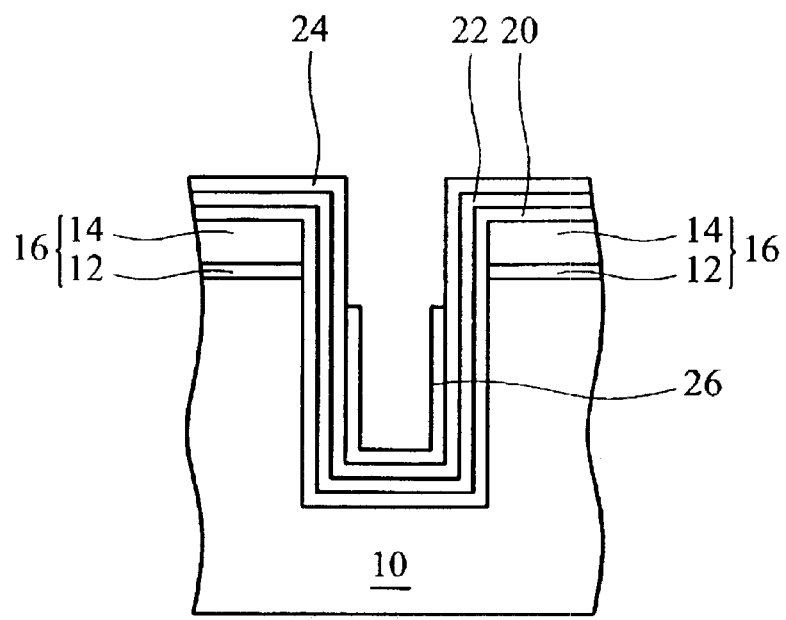
Figure 1F:
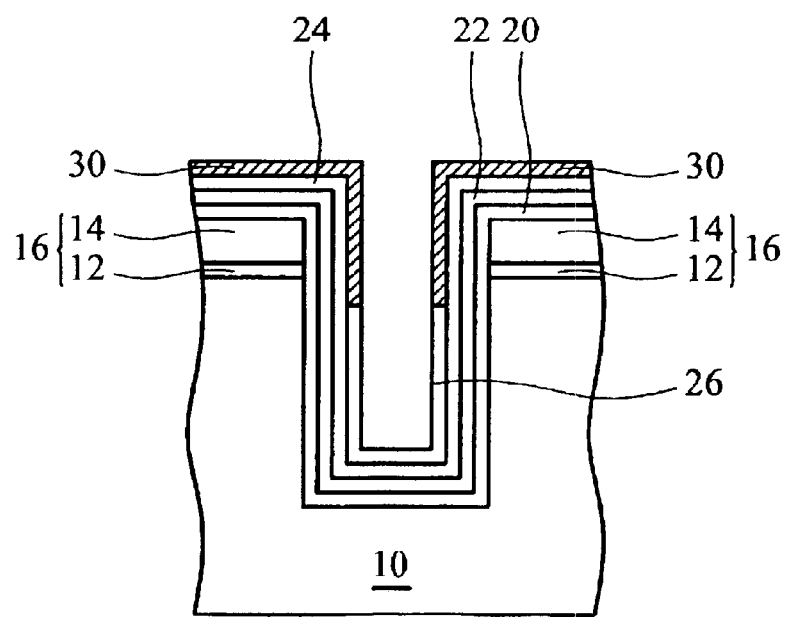
Figure 1G:
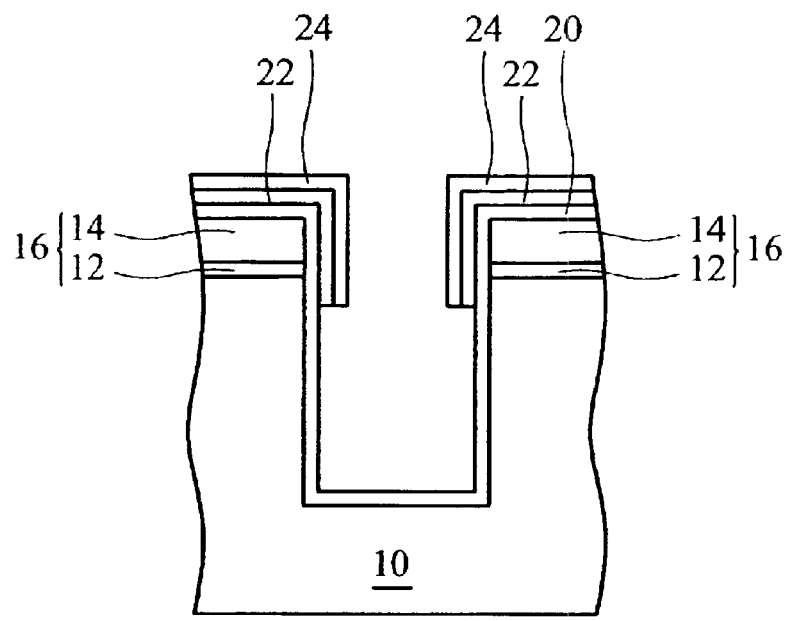
Figure 1H:
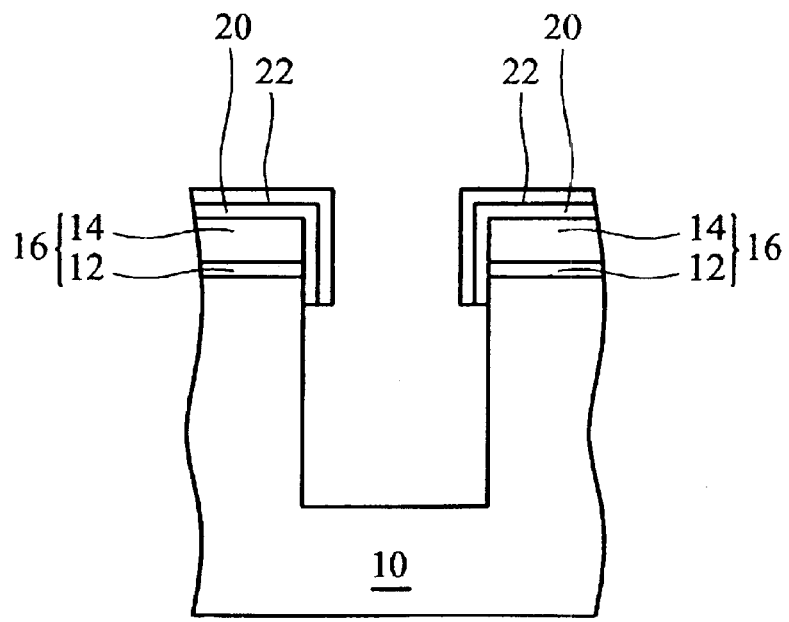
Figure 2A:
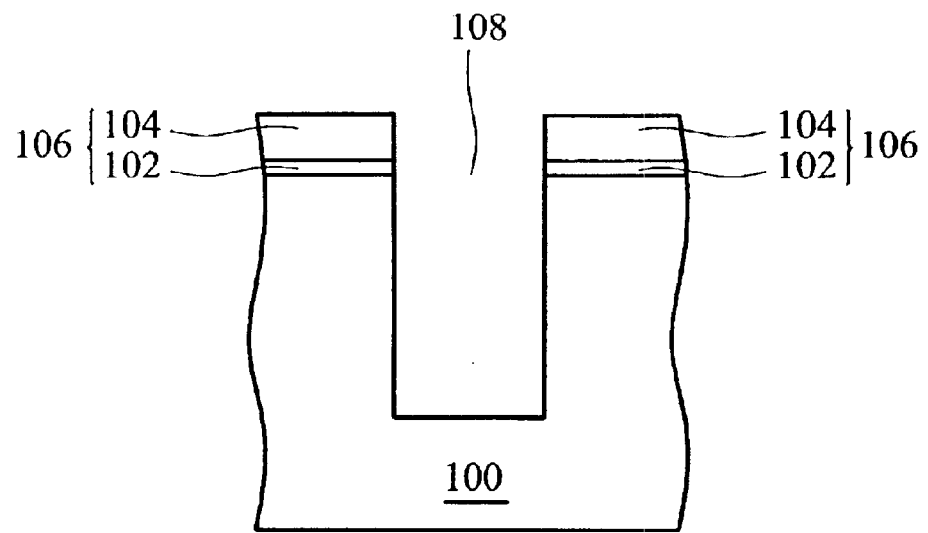
FIGS. 2A to 2I are cross-sections illustrating the process flow of forming a bottle trench according to the present invention.

Referring to FIG. 2A, a pad structure 106 including a nitride layer 104 and a pad oxide layer 102 is formed on a semiconducting substrate 100 such as a silicon substrate. For example, a pad oxide layer having a thickness of about 100 to 120 Å is formed by thermal oxidation. Then, a nitride layer 104 is formed on the pad oxide layer 102 by chemical vapor deposition (CVD). Next, a BSG (boron silicate glass) layer (not shown) is formed on the nitride layer 104 by CVD. Next, a photoresist pattern (not shown) is formed on the nitride layer 104 by photolithography. Next, the photoresist pattern is used as a mask to etch the uncovered BSG layer, nitride layer 104 and the underlying pad oxide layer 102, forming a pad structure 106 including the BSG layer, nitride layer 104, and pad oxide layer 102. Next, the photoresist layer and the pad structure 106 are used as an etching mask to etch by, for example, reactive ion etching (RIE), the uncovered substrate 100, forming a trench 108. Next, the photoresist pattern and the BSG layer are removed to obtain a structure shown in FIG. 2A.

Figure 2B:
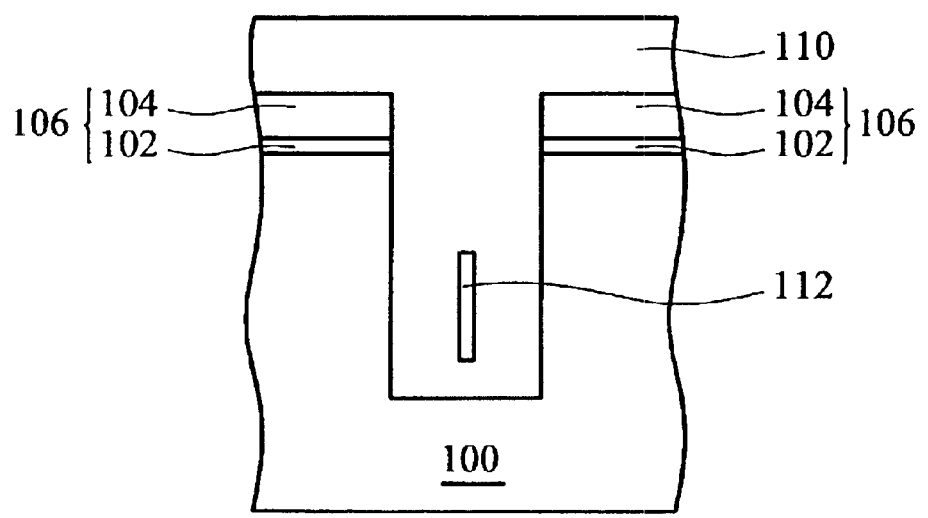

Subsequently, referring to FIG. 2B, a first insulating layer 110 is formed in the trench 108. For example, the first insulating layer 110 is formed in the trench 108 by CVD in the presence of TEOS (tera-ethyl-ortho-silicate) and ozone. If the aspect ratio is too high, a seam 112 may form in the insulating layer 110. However, if the process parameters and materials are appropriate, no void or seam forms. The following descriptions are based on the condition with a seam.

Figure 2C:
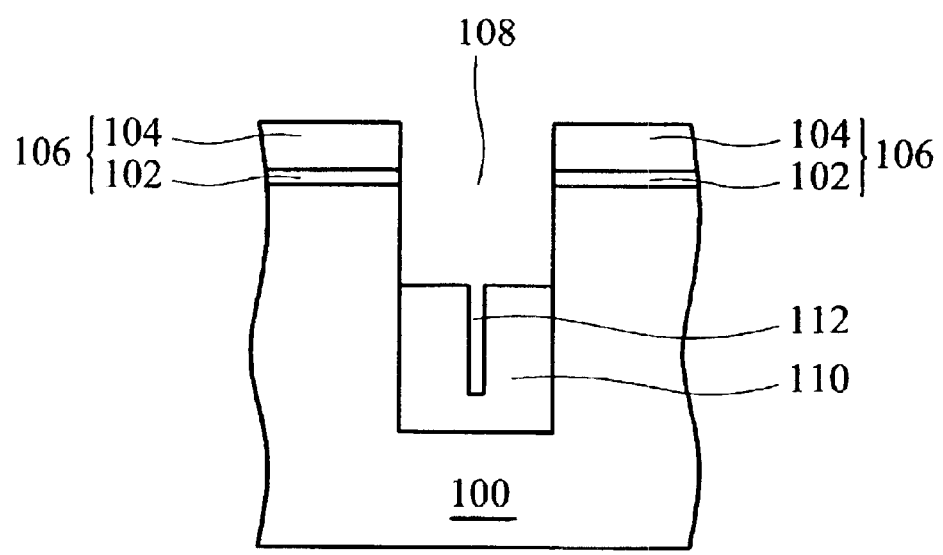

Subsequently, referring to FIG. 2C, a portion of the first insulating layer 110 is removed to a certain depth of the trench 108. For example, the removal can be conducted by dry etching or wet etching. Wet etching can be conducted using dilute HF solution or buffer oxide etchant (BOE).

Figure 2D:
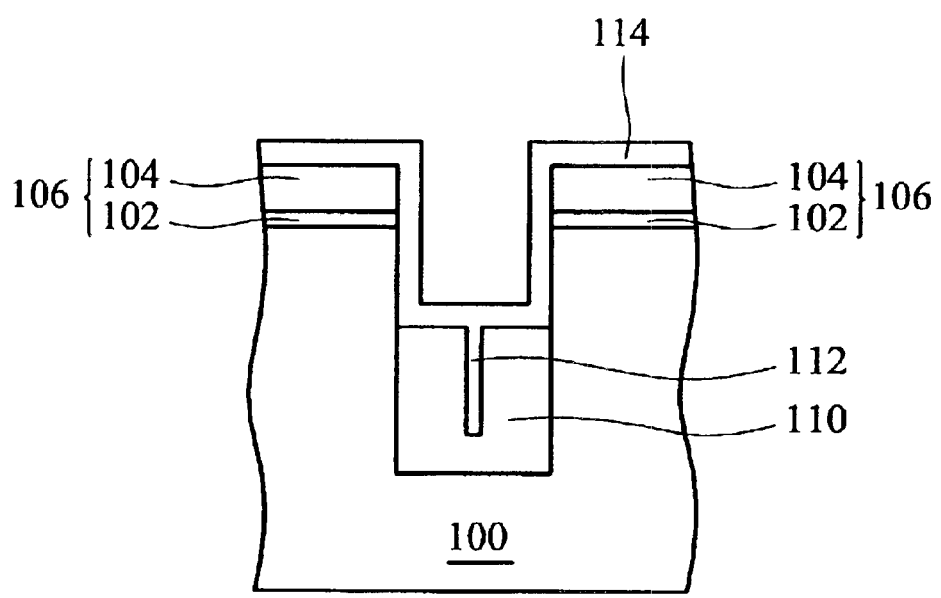

Subsequently, referring to FIG. 2D, a second insulating layer 114 is formed in the trench 108. The second insulating layer 114 can be an oxide layer formed by high density plasma chemical vapor deposition (HDP-CVD).

Figure 2E:
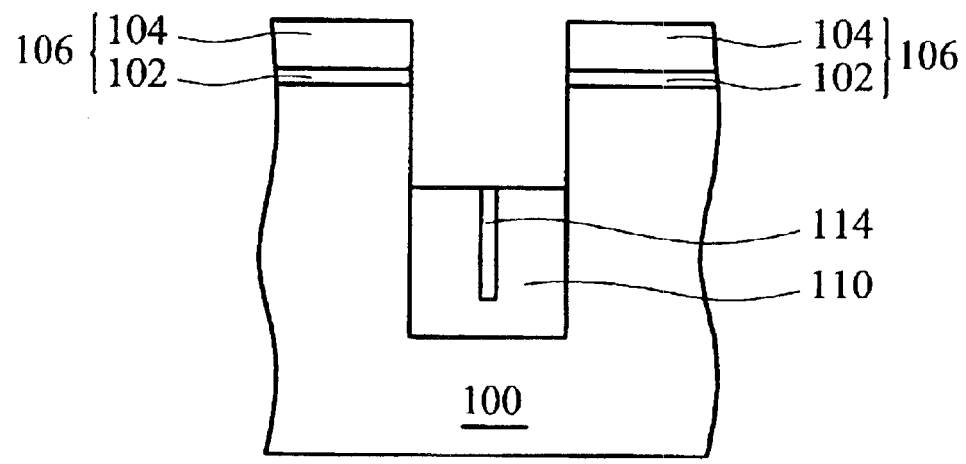

Subsequently, referring to FIG. 2E, portions of the second insulating layer 114 on the pad structure 106 and the sidewalls of the trench 108 are removed by, for example, isotropic etching.

Figure 2F:
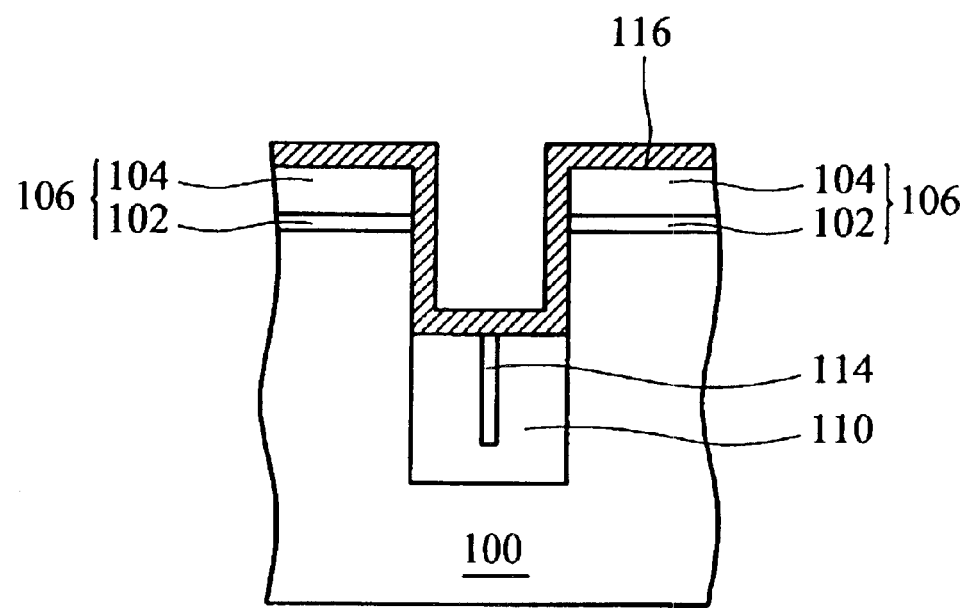

Subsequently, referring to FIG. 2F, a third layer 116 is formed in the trench 108. The third layer 116 can be a silicon nitride layer formed by low pressure CVD (LPCVD).

Figure 2G:
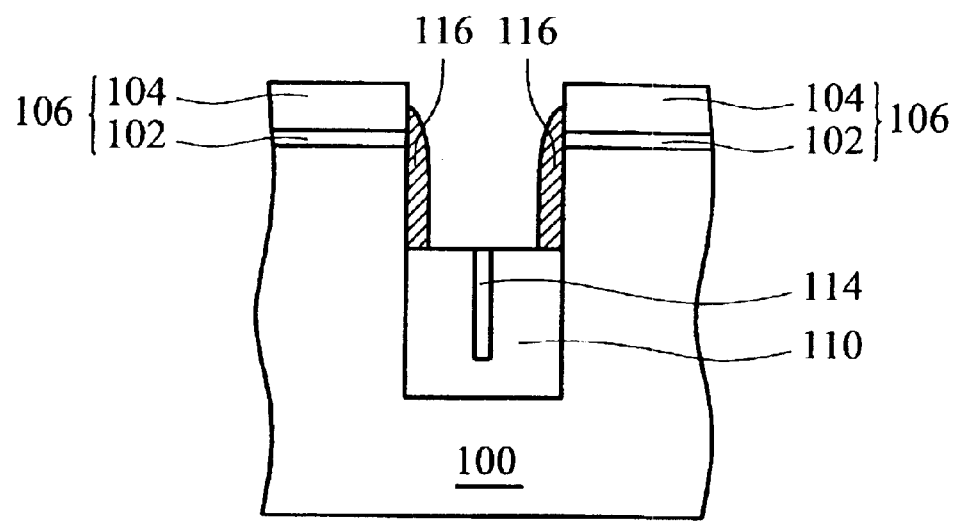

Subsequently, referring to FIG. 2G, the third layer 116 at the bottom and on the pad structure 106 is removed. The removal can be conducted by anisotropic etching, such as reactive ion etching (RIE).

Figure 2H:
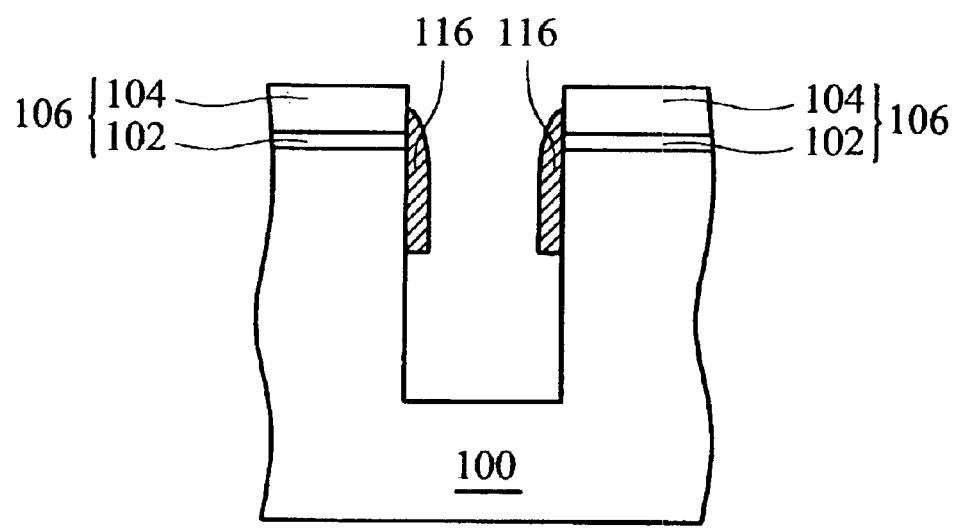

Subsequently, referring to FIG. 2H, the third layer 116 is used as a mask to remove the remaining second insulating layer 114 and the first insulating layer 110. The removal can be conducted by dry etching or wet etching. Wet etching can be conducted using dilute HF solution or BOE.

Figure 2I:
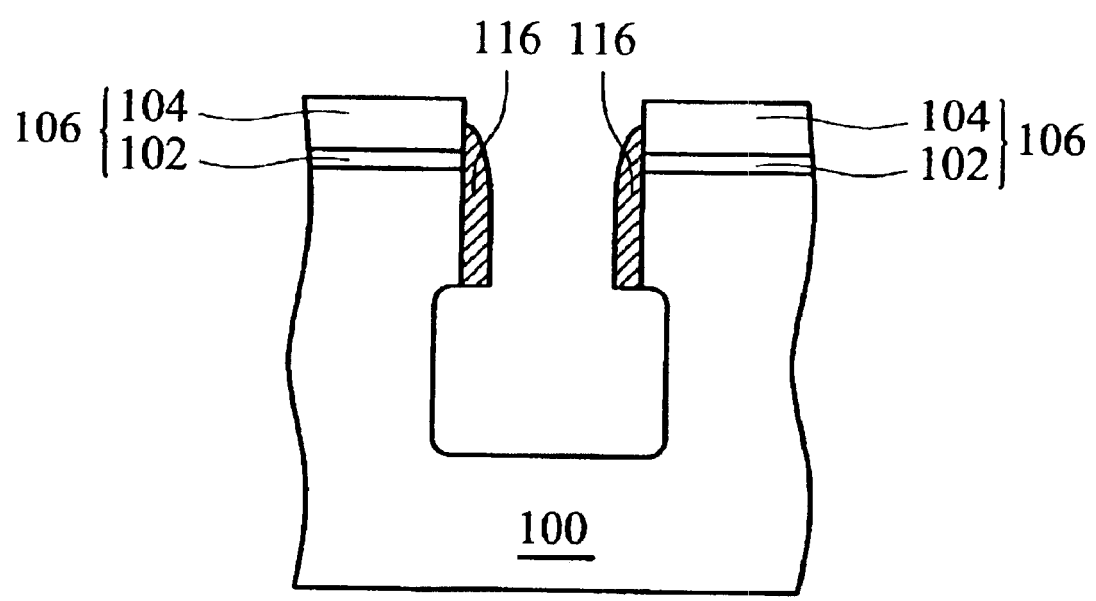

Finally, referring to FIG. 2I, wet etching is conducted (also called as wet bottle etching) such that the silicon substrate 100 uncovered by the etching stop layer 116 is etched, thus forming a bottle trench.

Compared to the conventional method, the method of the present invention has the following advantages: (1) the present invention uses TEOS as a sacrificial layer, making it easier than the conventional method, (2) the TEOS oxide layer can be easily removed by diluted HF solution, and (3) there is no need to add additional facilities, enabling easy application to mass production.

The foregoing description of the preferred embodiments of this invention has been presented for purposes of illustration and description. Obvious modifications or variations are possible in light of the above teaching. The embodiments chosen and described provide an excellent illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method for forming a bottle trench in a substrate having a pad structure and a trench, comprising the following steps:
    forming a first insulating layer in the trench;
    removing a portion of the first insulating layer to a certain depth of the trench;
    forming a second insulating layer in the trench;
    removing portions of the second insulating layer from the pad structure and the sidewalls of the trench;
    forming a third layer in the trench;
    removing a bottom portion of the third layer; and
    using the third layer as a mask to remove the remaining second insulating layer and the first insulating layer.

2. The method as claimed in claim 1, further comprising etching the substrate uncovered by the third layer to form a bottle trench.

3. The method as claimed in claim 1, wherein the third layer is silicon nitride formed by low pressure chemical vapor deposition.

4. The method as claimed in claim 1, wherein removal of a bottom portion of the third layer is conducted by anisotropic etching.

5. The method as claimed in claim 1, wherein the first insulating layer is tetra-ethyl-ortho-silicate (TEOS) formed by chemical vapor deposition.

6. The method as claimed in claim 1, wherein the second insulating layer is oxide formed by high density plasma chemical vapor deposition.

7. The method as claimed in claim 1, wherein removal of the first insulating layer is conducted by dry etching or wet etching.

8. A method for forming a bottle trench, comprising the following steps:
    providing a substrate having a pad structure and a trench;
    forming a first oxide layer in the trench;
    removing a portion of the first oxide layer to a certain depth of the trench;
    forming a second oxide layer in the trench;
    removing portions of the second oxide layer from the pad structure and the sidewalls of the trench;
    forming a third layer in the trench;
    removing a bottom portion of the third layer; and
    using the third layer as a mask to remove the remaining second oxide layer and the first oxide layer.

9. The method as claimed in claim 8, further comprising etching the substrate uncovered by the third layer to form a bottle trench.

10. The method as claimed in claim 8, wherein the third layer is silicon nitride formed by low pressure chemical vapor deposition.

11. The method as claimed in claim 8, wherein removal of a bottom portion of the third step third layer is conducted by anisotropic etching.

12. The method as claimed in claim 8, wherein the first oxide layer is tetra-ethyl-ortho-silicate (TEOS) formed by chemical vapor deposition.

13. The method as claimed in claim 8, wherein the second oxide layer is formed by high density plasma chemical vapor deposition.

14. The method as claimed in claim 8, wherein removal of the first oxide layer is conducted by dry etching or wet etching.

15. The method as claimed in claim 8, wherein the pad structure includes a pad oxide layer and a pad nitride layer.

16. A method for forming a bottle trench, comprising the following sequential steps:
    providing a substrate having a pad structure and a trench;
    forming a first oxide layer in the trench, wherein the first oxide layer is tetra-ethyl-ortho-silicate (TEOS);
    removing a portion of the first oxide layer by wet etching to a certain depth of the trench;
    forming a second oxide layer in the trench;
    removing portions of the second oxide layer from the pad structure and the sidewalls of the trench;
    forming a third layer in the trench;
    removing a bottom portion of the third layer; and
    using the third layer as a mask to remove the remaining second oxide layer and the first oxide layer by wet etching.

17. The method as claimed in claim 1, wherein during formation of the second insulating layer a seam formed during formation of the first insulating layer is filled with the second insulating layer.

18. The method as claimed in claim 8 or 16, wherein during formation of the second oxide layer a seam formed during formation of the first oxide layer is filled with the second oxide layer.

* * * * *